United States Patent
Bailey

(10) Patent No.: US 9,531,374 B2
(45) Date of Patent: Dec. 27, 2016

(54) LOW POWER DIE

(71) Applicant: STMICROELECTRONICS (RESEARCH & DEVELOPMENT) LIMITED, Marlow, Bucks. (GB)

(72) Inventor: Paul Reginald Bailey, Clevedon (GB)

(73) Assignee: STMICROELECTRONICS (RESEARCH & DEVELOPMENT) LIMITED, Marlow Bucks (GB)

( * ) Notice: Subject to any disclaimer, the term of this patent is extended or adjusted under 35 U.S.C. 154(b) by 0 days.

(21) Appl. No.: 14/548,417

(22) Filed: Nov. 20, 2014

(65) Prior Publication Data

US 2015/0155866 A1 Jun. 4, 2015

(30) Foreign Application Priority Data

Nov. 29, 2013 (GB) .................................. 1321098.4

(51) Int. Cl.
*G05F 1/10* (2006.01)
*H03K 17/687* (2006.01)
*H01L 27/12* (2006.01)
*H01L 29/786* (2006.01)

(52) U.S. Cl.
CPC ......... *H03K 17/687* (2013.01); *H01L 27/1203* (2013.01); *H01L 29/78609* (2013.01)

(58) Field of Classification Search
CPC .................. H01L 2924/00; H01L 2924/13091; H01L 2924/0002; H01L 2924/12032
See application file for complete search history.

(56) References Cited

U.S. PATENT DOCUMENTS

| | | | |
|---|---|---|---|
| 5,914,515 A | 6/1999 | Fukumoto et al. | |
| 2003/0001658 A1 | 1/2003 | Matsumoto | |
| 2004/0099966 A1* | 5/2004 | Chau | H01L 29/458 257/314 |
| 2007/0063763 A1* | 3/2007 | Yoo | G11C 11/4074 327/544 |
| 2008/0198679 A1* | 8/2008 | Lysinger | G11C 5/143 365/229 |
| 2009/0201082 A1* | 8/2009 | Smith | G06F 1/3203 327/544 |
| 2011/0233675 A1 | 9/2011 | Mazure et al. | |

* cited by examiner

*Primary Examiner* — Sibin Chen
(74) *Attorney, Agent, or Firm* — Allen, Dyer, Doppelt, Milbrath & Gilchrist, P.A.

(57) ABSTRACT

A functional circuit includes at least one silicon on insulator (SOI) transistor and at least one output terminal. A biasing circuit controls an operational voltage supplied to the functional circuit. The biasing circuit disables the at least one output terminal by controlling a reverse body bias voltage supplied to reverse body bias the at least one SOI transistor.

21 Claims, 6 Drawing Sheets

LOW POWER DIE

FIELD OF THE INVENTION

The present application relates to the power consumption of an integrated circuit, and in particular, but not exclusively, to switching off transistors of an integrated circuit.

BACKGROUND OF THE INVENTION

Applications or devices using integrated circuits often provide a low power or standby mode of operation in which power usage is conserved. Integrated circuit designers may also strive to provide a power efficient integrated circuit. To provide such power savings, a portion of an integrated circuit not currently being used may be switched off.

To implement this switch off of a portion of a circuit, a power island is created. A power island may be a portion of circuitry that can be switched off by removing power to that portion. Typically, a power island comprises circuitry carrying out or associated with a particular function of an integrated circuit. The circuitry of the power island may be surrounded by switches to remove the power, as well as isolation cells to clamp floating inputs (and thus prevent leakage and uncontrolled logic values) of cells fed by the power island outputs.

The size or footprint of circuitry is an important consideration in some applications of integrated circuits. In integrated circuits with power saving capabilities, these switches and isolation cells make a significant contribution to the overall footprint of the integrated circuit.

SUMMARY OF THE INVENTION

An apparatus comprises a functional circuit comprising one or more silicon on insulator (SOI) transistors and one or more output terminals, and a biasing circuit configured to control an operational voltage supplied to the functional circuit. The biasing circuit may be configured to disable the one or more output terminals by controlling the reverse body bias voltage supplied to reverse body bias the one or more transistors.

The silicon on insulator transistors may be fully depleted silicon on insulator transistors. The apparatus may be configured to disable the output terminals in response to an indication that the functional circuit is to be powered down. The output terminals may be fixed or enabled by the biasing circuit applying the reverse body bias voltage.

The biasing circuit may be configured to couple the operational voltage and the reverse body bias voltage to the functional circuit. The biasing circuit may comprise a first multiplexor configured to couple the operational voltage and the reverse body bias voltage to the functional circuit. The biasing circuit may further comprise a second multiplexor configured to couple an operational ground and a reverse body bias source ground to the functional circuit.

The first and second multiplexors may be analog multiplexors. A body leakage current of the transistors when reverse body biased may be negligible with regards to power dissipation of the functional circuit.

Another aspect is directed to an integrated circuit comprising a plurality of apparatus as described above, a first voltage generator for generating the operational voltage for the plurality of apparatus, and a second voltage generator for generating the reverse body bias voltage to reverse body bias the silicon on insulator transistors of the plurality of apparatus.

Another aspect is directed to method comprising controlling an operational voltage supplied to a functional circuit comprising one or more silicon on insulator transistors and one or more output terminals by disabling the one or more output terminals by controlling a reverse body bias voltage supplied to reverse body bias the one or more transistors.

The silicon on insulator transistors may be fully depleted silicon on insulator transistors. The method may further comprise disabling the output terminals in response to an indication that the functional circuit is to be powered down.

The method may further comprise coupling the operational voltage and the reverse body bias voltage supply to the functional circuit.

The method may further comprise generating the operational voltage by a first voltage generator, and generating the reverse body bias voltage by a second voltage generator.

Yet another aspect is directed to a device comprising at least one integrated circuit as described above. The device may be a system on a chip which may form part of a home entertainment system. The home entertainment system may be a set top box.

BRIEF DESCRIPTION OF THE DRAWINGS

Embodiments will now be described with reference to the following figures in which.

DETAILED DESCRIPTION OF THE PREFERRED EMBODIMENTS

Figure 1:
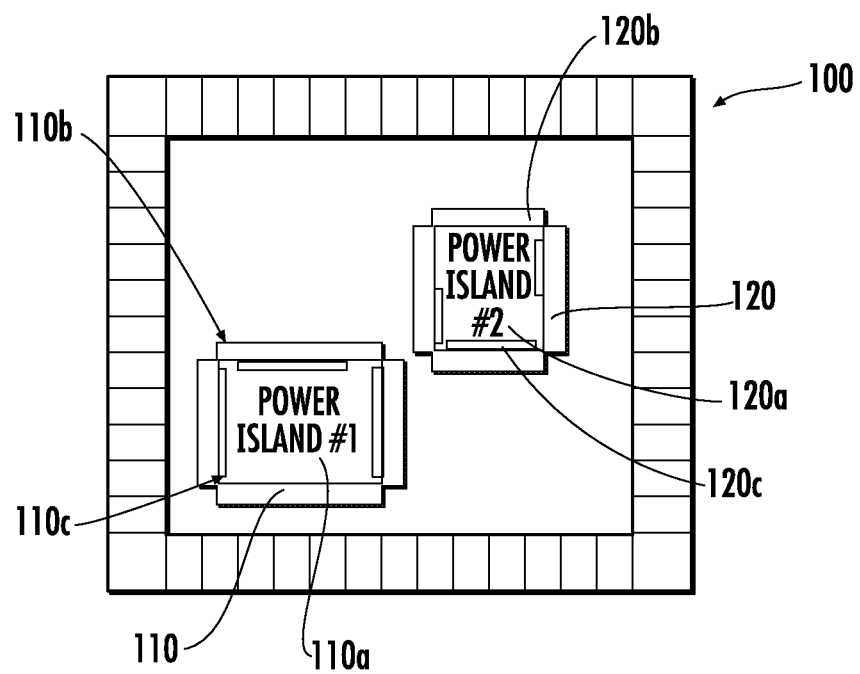
FIG. 1 shows an example of an integrated circuit comprising power islands in accordance with the present invention.

One method of implementing power islands on an integrated circuit die is shown in FIG. 1. FIG. 1 shows an integrated circuit die 100 having a first power island 110 and a second power island 120. Each power island 110, 120 may comprise circuitry 110a and 120a which may carry out one or more functions on the integrated circuit die. The circuitry 110a and 120a may be surrounded by power switch cells 110b and 120b which may disconnect the circuitry 110a and 120a from a power supply.

The on-die power switches 110b and 120b may be provided to disconnect all the power or voltage connections of the circuitry 110a and 120a to reduce the power consumption of the integrated circuit. This may be, for example, when the integrated circuit is placed into a low power mode and/or when the circuitry 110a and/or 120a is not currently active. The power switches 110b and 120b are provided to prevent leakage current in the circuitry 110a and 120a. In addition to the power switches 110b and 120b, the power islands 110 and 120 may also comprise isolation cells 110c and 120c. The isolation cells 110c and 120c may prevent outputs of the circuitry 110a and 120a from floating.

Figure 2:
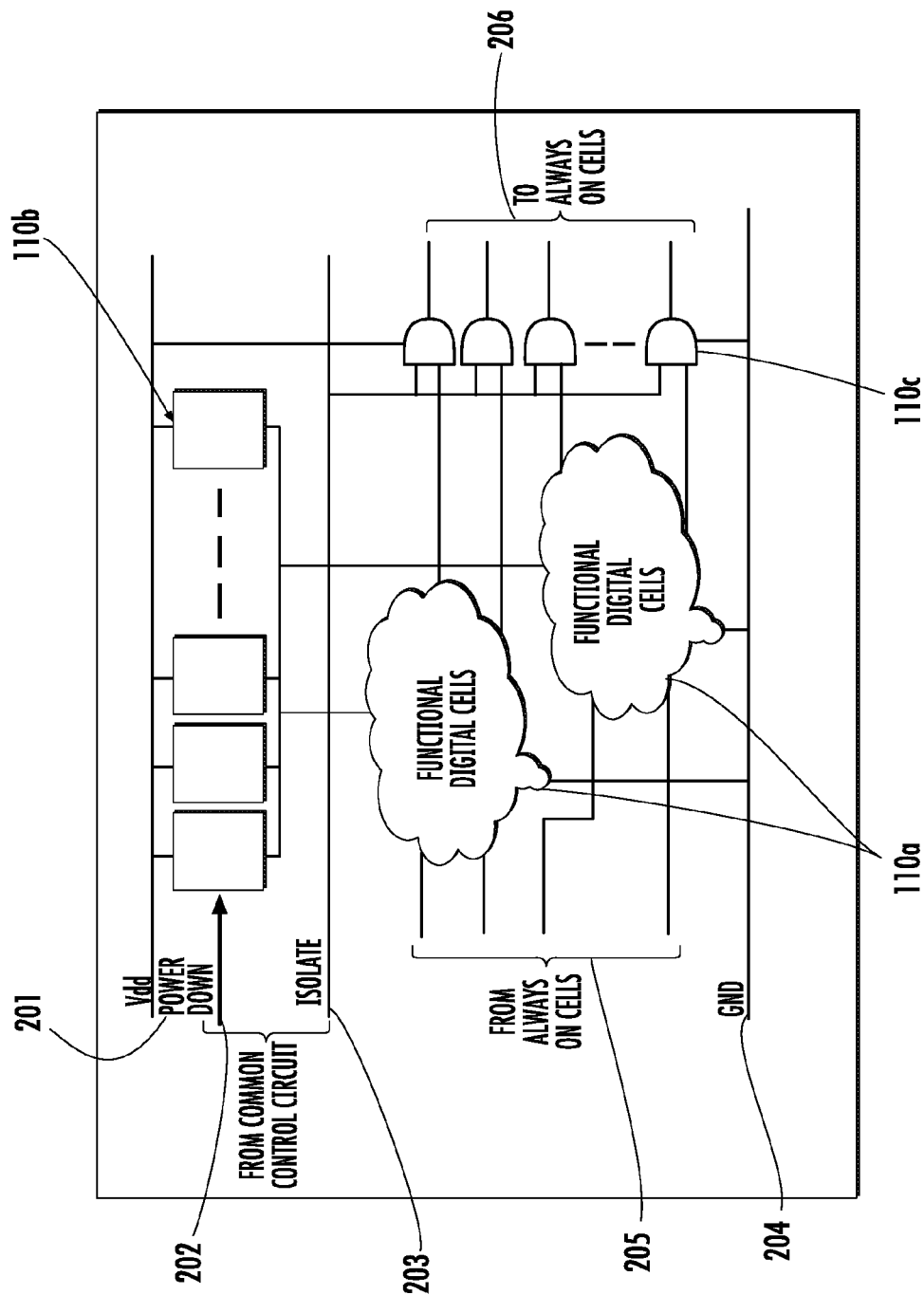
FIG. 2 is a schematic diagram showing the layout of a power island in accordance with the present invention.

FIG. 2 shows a schematic diagram of a power island 110a or 120a. FIG. 2 shows the circuitry 110a comprising functional digital cells. The functional digital cells 110a are coupled to a power input Vdd via the power switches 110b. The circuitry 110a may comprise groups of functional digital cells where each group may be made up of at least one transistor. Each group may be coupled to the power input 201 via one or more of the power switches 110b. Each group may also be coupled to a supply ground 204.

The functional digital cells may be coupled to input signals 205 and provide output signals 206. In this example only the inputs and outputs from and to other cells of other circuitry that require isolation are depicted. The inputs and outputs may be to and from other power islands which may be turned off.

Isolation cells may be provided on inputs and/or outputs coupled to other circuitry where the other circuitry may be on or active when the circuitry 110a is off or inactive. This may be because turning the circuitry 110a off (i.e., decoupling from a supply voltage) may cause the input and/or output terminals to float. These floating terminals may cause the other circuitry to operate in error.

Isolation cells 110c are provided on the output signals 206 that go to other cells of other circuitry that may be on in some cases when the power island 110a is off. The power switches 110b may be coupled to a power down control signal 202. This signal 202 may turn the switches 110b on and off according to a power mode of the circuitry 110a and/or whether the circuitry is active or inactive. The isolation cells 110c may be connected to an isolate signal 203 which controls their operation to isolate the outputs 206 when the circuitry 110a is powered down.

It can be seen from FIGS. 1 and 2 that implementing a power island using power switches that disconnect functional digital cells from a power source and isolation cells for isolating outputs that may otherwise float may increase the area required for circuitry 110a and 120a.

Embodiments of the present application provide a method and circuitry for providing a power island while bearing in mind the area constraints of modern integrated circuit design. In some embodiments functional digital cells of circuitry forming a power island may be implemented with transistors having insulated drain-body junctions, for example, FD-SOI transistors.

The powering down or switching off of the power island may be carried out by putting these transistors into a reverse body bias. For example, placing these FD-SOI transistors in a reverse body bias may turn the FD-SOI transistors off while reducing any leakage current. This leakage current may cause power dissipation while the circuitry is inactive or off.

An advantage of turning the circuitry off or making it inactive is to reduce power consumption. Instead of having to provide a power switch for each group of functional digital circuitry, only circuitry to provide a reverse body bias voltage across all the functional digital circuits is implemented. Additionally, as the insulated drain-body junction transistors are reverse body biased, the outputs of the power island may not float. This is due to the reverse body bias voltage applied to the circuitry.

In some embodiments, isolation cells are not required to isolate inputs and/or outputs of off circuitry. The circuitry to provide reverse body bias may be implemented as low current analog multiplexors. In one example, the insulated drain-body junction transistor may be a fully depleted (FD) silicon on insulator (SOI) transistor. The following examples are described with reference to these FD-SOI transistors.

It will, however, be appreciated that other transistors may be used. In particular, transistors having insulated drain-body junctions that have negligible leakage current in a reverse body bias may be used. Here, leakage current is considered to be negligible in terms of floating outputs, if the leakage current is low enough that the outputs do not float in a way that will affect other circuitry coupled to that output.

Figure 3:
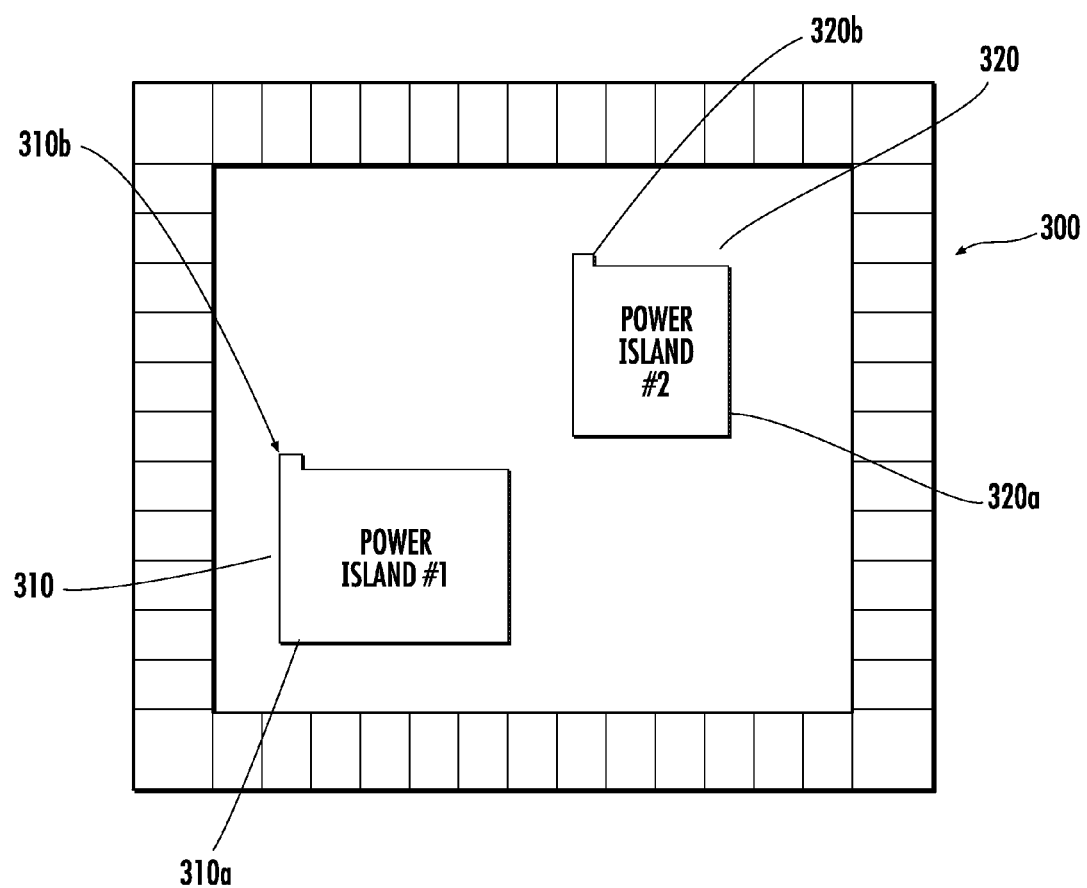
FIG. 3 shows an integrated circuit comprising functional circuitry in accordance with the present invention.

FIG. 3 shows an example of one embodiment of an integrated circuit die comprising power islands. FIG. 3 comprises an integrated circuit die 300 comprising a first power island 310 and a second power island 320. Each of the power islands may comprise circuitry 310a and 320a. The circuitry 310a and 320a may comprise one or more of functional digital cells made up of a number of FD-SOI transistors.

Each of the power islands is provided with a respective reverse body bias circuit, for example, analog voltage multiplexor 310b and 320b, for applying a reverse body bias voltage to the transistors in the circuitry 310a and 320a. This switches the power island 310 and 320 into a very low leakage state comparable with supply off.

The functional circuitry of the power island may be switched off by placing the transistors making up the circuitry into a reverse body bias mode of operation. In order for the circuitry to be sufficiently switched off, the transistors are implemented with FD-SOI technology with buried gates.

Reverse body biasing a transistor may be used to reduce the leakage current of a transistor in its sub-threshold mode of operation. Applying reverse body bias to the body of a transistor may increase the threshold voltage $V_{TH}$ of the transistor, which in turn reduces the drain-source leakage current of the transistor in the off or sub-threshold mode of operation.

In conventional bulk metal oxide semiconductor (MOS) transistors, increasing the reverse body bias (to reduce the drain source leakage current) eventually results in an increased drain-body leakage and may lead to latch-up. Latch-up is a type of short circuit fault that may occur in integrated circuits. Therefore, in typical MOS applications, the leakage current reduction of reverse body biasing may be limited. In the illustrated embodiments, the transistors of the functional digital circuit are implemented as FD-SOI transistors. An example of the structure of an FD-SOI transistor is shown in FIG. 4.

Figure 4:
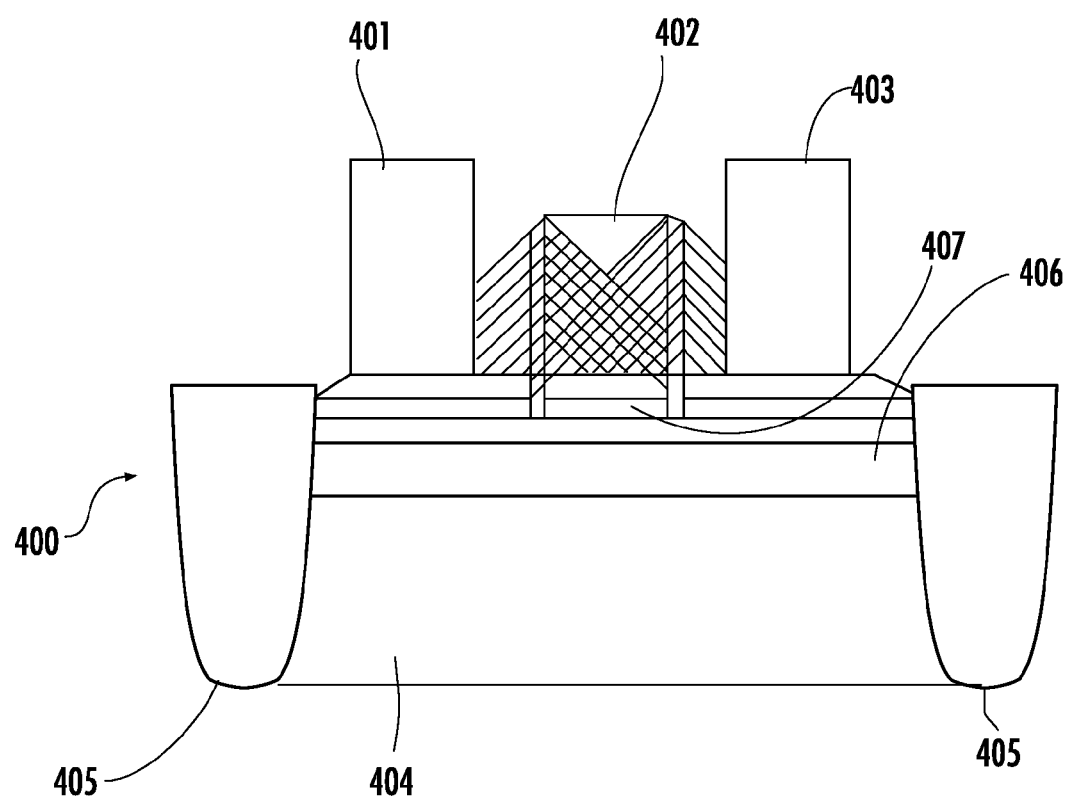
FIG. 4 is a schematic diagram showing the structure of a fully depleted silicon on insulator transistor in accordance with the present invention.

FIG. 4 shows a cross-section of an FD-SOI transistor. The transistor 400 comprises a source 401, gate 402 and drain 403 on a base silicon substrate 404. Isolation elements 405 are provided to isolate a transistor from other transistors that may be implemented on the same substrate 404. The transistor 400 further includes a thin buried oxide layer 406 and a thin silicon layer 407 at the gate 402.

In an FD-SOI transistor, the drain-body junction is now insulated by the buried oxide layer 406. In other words, the drain-body leakage path no longer exists. A larger reverse body bias voltage may therefore by applied to the transistor, turning it more off, without conventional MOS drain-body leakage effects.

InSOI transistors there may be no gate-substrate junctions as shown, for example, in FIG. 4. In contrast, bulk technology may provide isolation diffusions/buried layers of opposite polarity under the zone containing the gate and these layers may be reverse-biased relative to the substrate. In operation this bias is usually maintained. In SOI transistors this limitation regarding the maintenance of the bias may be removed.

Additionally in some examples in bulk technology, the effect of biasing of the buried layers on the threshold voltage $V_{TH}$ may be limited by a (relatively) large amount of silicon between the place where the bias is applied and the actual gate region. In FD-SOI transistors, the well underneath the gate region may be fabricated to be very thin. This may cause the electrostatic effect of the biasing on the threshold voltage $V_{TH}$ to be stronger than if the silicon in that region was thicker.

The threshold voltage $V_{TH}$ may be considered to be threshold voltage of the transistor. The threshold voltage $V_{TH}$ may be the value of voltage across the gate-source of the transistor at which a conducting channel of the transistor begins to connect the source and drain contacts of the transistor. This connection between the source and drain may allow significant current.

Figure 5:
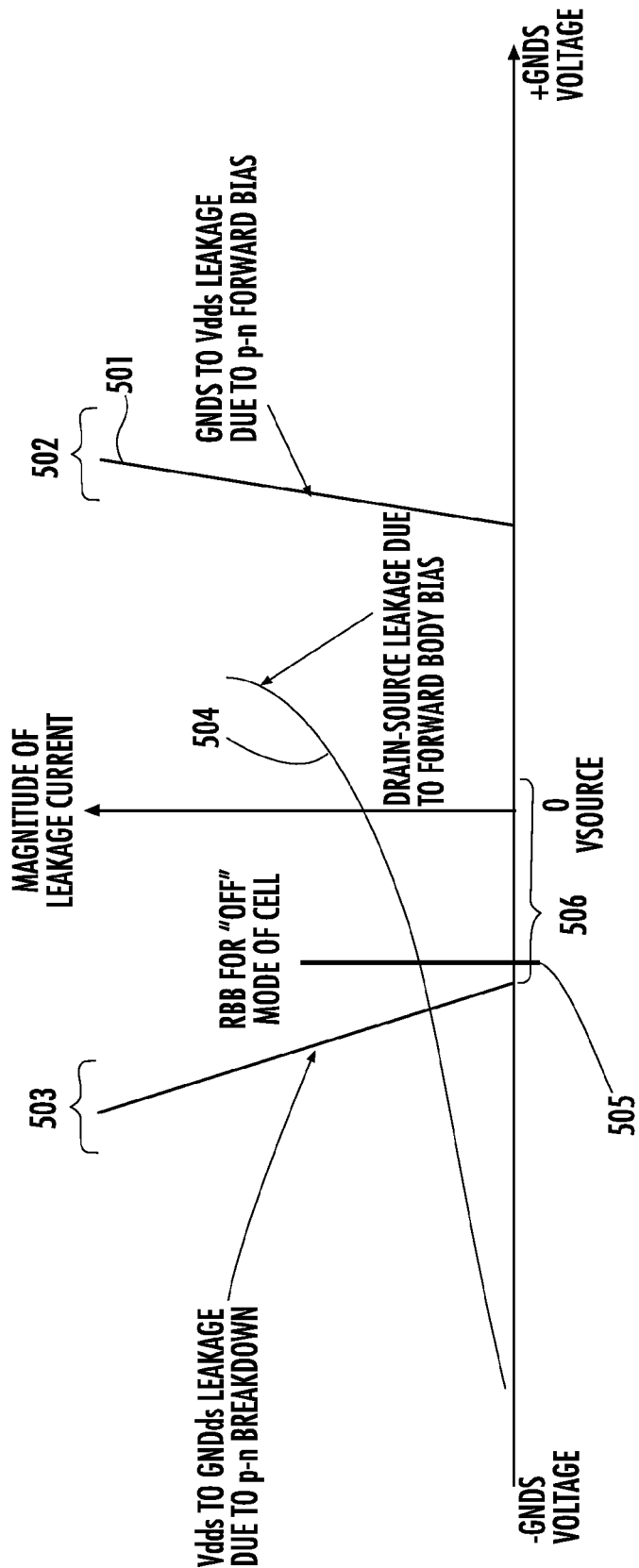
FIG. 5 is a graph of a body-bias voltage applied to a transistor and corresponding leakage current in accordance with the present invention.

FIG. 5 shows an example of the operational modes of an FD-SOI. FIG. 5 plots the magnitude of the leakage current against the body bias applied to one transistor in a CMOS transistor pair. Line 501 plots the leakage current between the p-well and n-well bias voltages applied to the transistor pair. The leakage current that occurs due to a forward biasing to the p-well and n-well junction of the transistor is shown at line 502. The leakage current caused by a breakdown of the p-well to the n-well junction when the transistor is reverse body biased is shown at line 503. The drain source leakage current is shown at line 504.

The leakage current (body leakage) when the transistor is reverse body biased but before the p-n junction breakdown is shown at line 506. It can be seen that this leakage current is negligible. Line 505 shows an example of a reverse body bias that may be applied to power the transistor down while incurring negligible body leakage and minimal overall leakage.

Figure 6:
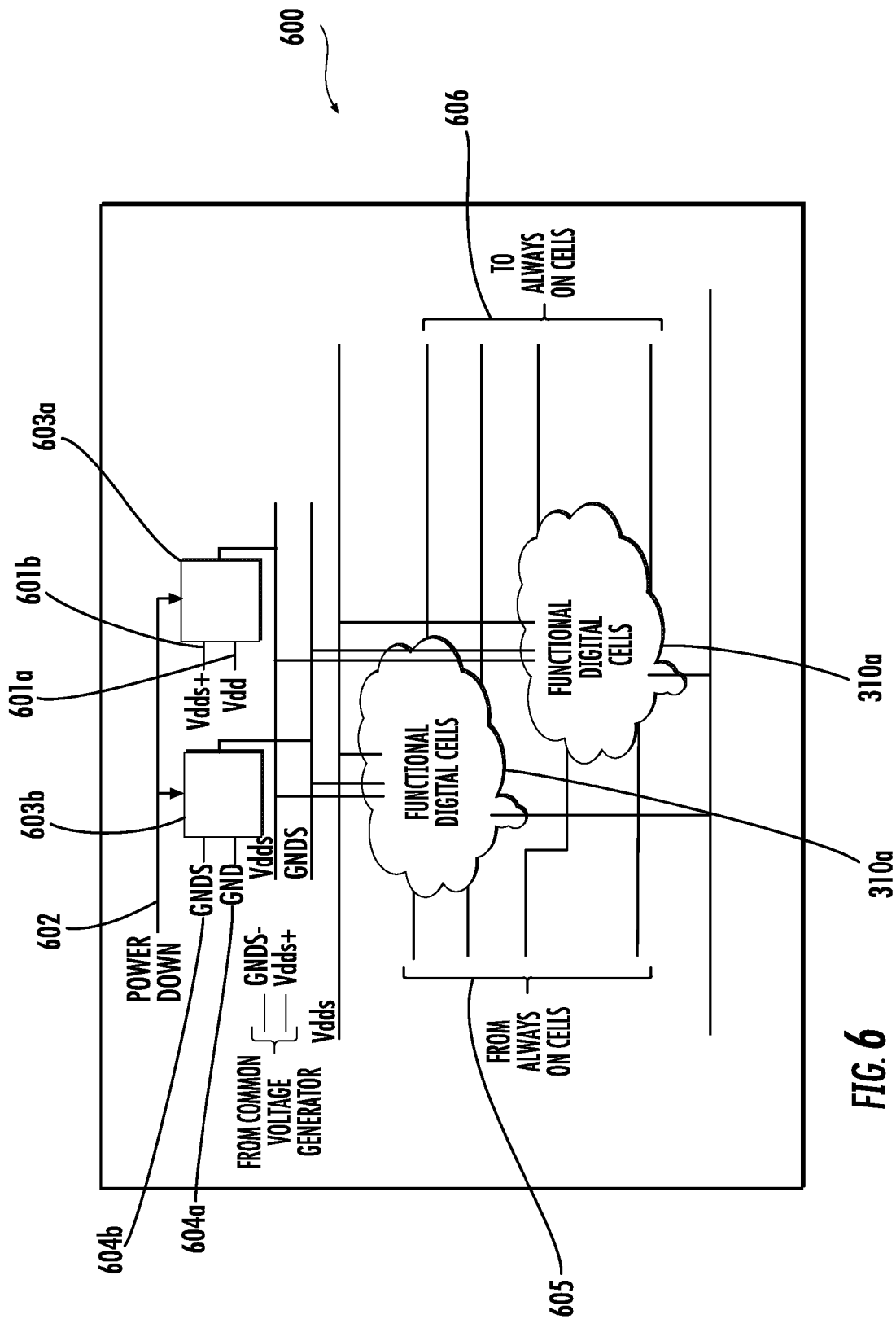
FIG. 6 is a schematic diagram showing the layout of a functional circuit in accordance with the present invention.

It can be seen that the amount of reverse body bias applied may be limited by the p-n junction breakdown at line 503. However, the body bias voltage at which this effect occurs typically allows more leakage reduction compared with conventional MOS transistors. FIG. 6 shows an example of a power island implemented using reverse body bias and FD-SOI transistors.

FIG. 6 comprises a power island 600 comprising circuitry 310a. The circuitry 310a may comprise one or more groups of functional digital cells that may carry out functionality of the circuitry 310a. Each group of functional digital cells may comprise two or more transistors. Each of the transistors may be fabricated using FD-SOI technology.

The circuitry 310a may be coupled to inputs from other power islands and/or circuitry as well as provide outputs to other power islands and/or circuitry. The inputs from circuitry that may be on when the power island 600 is off are shown at 605. Similarly the outputs to circuitry that may be on when the power island is switched off are shown at 606. The power island 600 may comprise further inputs and/or outputs.

In order to switch the power island off, the power island 600 includes a first voltage multiplexor 603a and a second voltage multiplexor 603b. The first voltage multiplexor 603a and second voltage multiplexor 603b may be coupled to provide either zero body bias voltage, or reverse body bias voltage, to the transistors forming the circuitry 310a. The body bias provided may be selected by the power down signal 602.

In this embodiment, the first analog voltage multiplexor 603a may switch between the supply voltage 601a and a positive reverse body bias voltage 601b. The second switch 603b may switch between ground 604a and a negative reverse body bias voltage 604b. The use of positive and negative voltage is dependent on the type of transistor used and may be reversed in some cases.

The supply voltage and ground may correspond to a power required by the circuitry 310a in a functional mode of operation and the reverse body bias voltages may correspond to voltages required to apply a reverse body bias to the NMOS and PMOS transistors of the circuitry. The NMOS and PMOS transistors may be fabricated using FD-SOI technology.

The positive reverse body bias voltage may be provided by a first voltage generator and the negative reverse body bias voltage by a second voltage generator. Alternatively, the positive and negative reverse body bias voltages may be provided by a common voltage generator.

In operation, the circuitry 310a may be functioning in a normal mode of operation. In this case, the power down line 602 may not be asserted. Normal operating body bias voltages may be applied to the circuitry. For example, the first analog voltage multiplexor 603a may couple the circuit PMOS body to the operational voltage 601a and the second analog voltage multiplexor may couple the circuit NMOS body to ground 604a.

At some point it may be determined that the circuitry 310a is to operate in a low power or off mode. This may be because the integrated circuit die is going into standby mode and/or because the functionality of the circuitry 310a is no longer needed.

The power down line 602 may be asserted to indicate that the power island 600 or circuitry 310a is to be switched off. The first and second voltage multiplexor 603a and 603b may select an output to provide a reverse body bias voltage to the circuitry 310a in response to the power down line 602 being asserted.

The first analog voltage multiplexor 603a may de-couple the supply voltage 601a from the circuit PMOS body and instead couple the higher reverse body bias voltage 601b to the circuit PMOS body. Similarly, the second analog voltage multiplexor 603b may de-couple the operational ground 604a from the circuit NMOS body and couple the lower reverse body bias voltage 604b to the circuit NMOS body. When the reverse body bias voltage is coupled to the circuitry 310a, one or more FD-SOI transistors making up the circuitry 310a may start operating in a reverse body bias mode. In this mode, the FD-SOI transistors may be considered to be switched off while providing little leakage current. The power island 600 may also be considered switched off.

Some embodiments may provide a silicon area saving for the same functionality with as many on-die power switches being removed. Additionally, in some embodiments, the main power supply stripes may not be cut with power switch cells. This may lead to an improved power supply to the cells. Some embodiments may provide less IR drop noise which may result in better performance when the circuit is on. In some embodiments, the need for isolation cells and associated control logic may be removed as the cell outputs may not float. The cell outputs may freeze, for example, at a logic 0 or 1 level.

In some integrated circuits, forward body bias may be provided. In these cases, implementing a power island may not incur any silicon area cost. The requirement of minimal analog voltage multiplexors to provide a reverse body bias may lead to easier creation of power islands and more designer freedom in where these islands may be created. Some embodiments may provide large power islands as the body bias terminals of cells may not consume much static current. For example, a large percentage of a chip may be switched off using a single bias voltage generator and analog voltage multiplexer pair.

In the foregoing, the functional circuitry has been described as being on or off and/or active or inactive. On or active refers to a mode of operation of the circuitry in which the circuitry is to be used to carry out a function while off or inactive corresponds to a mode of operation in which the circuitry is not to be used and may be made inactive or disabled in order to save power.

The foregoing has described functional circuitry that may comprise two or more transistors. The transistors may be arranged in a transistor pair. For example, the transistors may be fabricated as complimentary transistor pairs sharing a common substrate. The pair may, for example, be fabricated on an n-doped silicon wafer. To make an n-channel FET on the n-doped wafer, a p-doped well may be implanted or diffused into the substrate. In some cases, this may be the other way around.

The foregoing has described the operational voltage as being a positive supply voltage and ground. However, other transistor polarities may be applied. For example, a negative supply voltage and ground may be applied. Similarly, the reverse bias voltages may differ for the type and arrangement of the transistors.

The functional circuits of the foregoing may form part of an apparatus, for example, a power island. An integrated circuit may comprise one or more of these power islands which may implement the functionality of the integrated circuit. It will be appreciated that the integrated circuit may comprise circuitry in addition to the power island. For example, the integrated circuit may comprise a first voltage generator for generating an operational voltage and a second voltage generator for generating a reverse body bias voltage. In some embodiments these voltage generators may be external to the integrated circuit.

An integrated circuit may include a power island incorporated into a device comprising one or more of these integrated circuits. The device may be, for example, part of a set-top box, mobile phone, processing system, control system or other system making use of integrated circuits. For example, the integrated circuit may form a system on a chip in a home-entertainment system, such as a set-top box.

The invention claimed is:

1. An integrated circuit comprising:
   a plurality of power islands, each power island comprising
      a plurality of functional circuits, each functional circuit comprising at least one silicon on insulator (SOI) transistor, at least one input terminal, and at least one output terminal, and
      a biasing circuit configured to control an operating voltage supplied to said plurality of functional circuits, and to disable the output terminals by controlling a reverse body bias voltage supplied to reverse body bias said SOI transistors;
   at least one of said functional circuits is configured so that the at least one input terminal is coupled to the at least one output terminal from another functional circuit that is powered on when said at least one of said functional circuits is powered off; and
   said at least one of said functional circuits is configured so that the at least one output terminal is coupled to the at least one input terminal to a different functional circuit that is also powered on when said at least one of said functional circuits is powered off.

2. The apparatus of claim 1 wherein each SOI transistor comprises a fully depleted SOI transistor.

3. The apparatus of claim 1 wherein each basing circuit is configured to disable the output terminals in response to an indication that said plurality of functional circuits are to be powered down.

4. The apparatus of claim 1 wherein the output terminals are enabled by said biasing circuit applying the reverse body bias voltage.

5. The apparatus of claim 1 wherein each biasing circuit is configured to couple the operating voltage and the reverse body bias voltage to said plurality of functional circuits.

6. The apparatus of claim 5 wherein each biasing circuit comprises a first multiplexor configured to couple the operational source voltage and the reverse body bias source voltage to said plurality of functional circuits.

7. The apparatus of claim 6 wherein each biasing circuit further comprises a second multiplexor configured to couple an operational ground and a reverse body bias source ground to said plurality of functional circuits.

8. The apparatus of claim 1 wherein a body leakage current of said each transistor when reverse body biased is negligible with regards to power dissipation of said plurality of functional circuits.

9. An integrated circuit comprising:
   a plurality of power islands, each power island comprising
      a plurality of functional circuits, each functional circuit comprising at least one silicon on insulator (SOI) transistor, at least one input terminal, and at least one output terminal, and
      a biasing circuit coupled to said plurality of functional circuits and configured to control an operating voltage supplied thereto, and to disable the output terminals by controlling a reverse body bias voltage supplied to reverse body bias said SOI transistors;
   a first voltage generator for generating the operating voltage for said plurality of power islands; and
   a second voltage generator for generating the reverse body bias voltage for said plurality of power islands;
   at least one of said functional circuits is configured so that the at least one input terminal is coupled to the at least one output terminal from another functional circuit that is powered on when said at least one of said functional circuits is powered off; and
   said at least one of said functional circuits is configured so that the at least one output terminal is coupled to the at least one input terminal to a different functional circuit that is also powered on when said at least one of said functional circuits is powered off.

10. The integrated circuit of claim 9 wherein each SOI transistor comprises a fully depleted SOI transistor.

11. The integrated circuit of claim 9 wherein each basing circuit is configured to disable the output terminals in their respective power island in response to an indication that said plurality of functional circuits are to be powered down.

12. The integrated circuit of claim 9 wherein the output terminals in each power island are enabled by said biasing circuit applying the reverse body bias voltage.

13. The integrated circuit of claim 9 wherein each biasing circuit is configured to couple the operating voltage and the reverse body bias voltage to said plurality of functional circuits.

14. The integrated circuit of claim 13 wherein each biasing circuit comprises a first multiplexor configured to couple the operating voltage and the reverse body bias voltage to said plurality of functional circuits.

15. The integrated circuit of claim 14 wherein each biasing circuit further comprises a second multiplexor configured to couple an operational ground and a reverse body bias source ground to said plurality of functional circuits.

16. The integrated circuit of claim 9 wherein a body leakage current of each transistor when reverse body biased is negligible with regards to power dissipation of said functional circuit associated therewith.

17. A method for operating an integrated circuit comprising a plurality of power islands, each power island comprising a plurality of functional circuits comprising at least one silicon on insulator (SOI) transistor, at least one input terminal, and at least one output terminal; and a biasing circuit coupled to the plurality of functional circuits, the method comprising:
   operating each bias circuit to
      control the operating voltage supplied to the plurality of functional circuits, and
      disable the output terminals by controlling a reverse body bias voltage supplied to reverse body bias the SOI transistors;
   at least one of the functional circuits is configured so that the at least one input terminal is coupled to the at least one output terminal from another functional circuit that is powered on when the at least one of the functional circuits is powered off; and
   the at least one of the functional circuits is configured so that the at least one output terminal is coupled to the at least one input terminal to a different functional circuit that is also powered on when the at least one of the functional circuits is powered off.

18. The method of claim 17 wherein each SOI transistor comprises a fully depleted SOI transistor.

19. The method of claim 17 further comprising disabling the output terminals in a respective power island in response to an indication that the plurality of functional circuits therein are to be powered down.

20. The method of claim 17 further comprising coupling the operating voltage and the reverse body bias voltage to the plurality of functional circuits.

21. The method of claim 17 further comprising:
   providing a first voltage generator for generating the operating voltage; and
   providing a second voltage generator for generating the reverse body bias voltage.

* * * * *